United States Patent [19]
Abe

[11] Patent Number: 6,031,780
[45] Date of Patent: Feb. 29, 2000

[54] SEMICONDUCTOR MEMORY DEVICE

[75] Inventor: Hirohisa Abe, Hyogo, Japan

[73] Assignee: Ricoh Company, Ltd., Tokyo, Japan

[21] Appl. No.: 09/262,342

[22] Filed: Mar. 4, 1999

[30] Foreign Application Priority Data

Mar. 24, 1998 [JP] Japan ................................. 10-075387

[51] Int. Cl.[7] .................................................. G11C 7/00
[52] U.S. Cl. ...................... 365/227; 365/226; 365/230.03
[58] Field of Search .................................... 365/226, 227, 365/229, 189.09, 230.03

[56] References Cited

U.S. PATENT DOCUMENTS

| | | | |
|---|---|---|---|
| 5,384,740 | 1/1995 | Etoh et al. | 365/189.09 |
| 5,490,118 | 2/1996 | Nishioka et al. | 365/229 |
| 5,563,839 | 10/1996 | Herdt et al. | 365/227 |
| 5,703,475 | 12/1997 | Lee et al. | 323/313 |

FOREIGN PATENT DOCUMENTS

| | | |
|---|---|---|
| 5-206752 | 8/1993 | Japan . |
| 6-242847 | 9/1994 | Japan . |
| 9-17181 | 1/1997 | Japan . |
| 10-326493 | 12/1998 | Japan . |

*Primary Examiner*—Son Mai
*Attorney, Agent, or Firm*—Dickstein Shapiro Morin & Oshinsky LLP

[57] ABSTRACT

A semiconductor memory device includes a plurality of memory arrays which are provided on a semiconductor chip, the memory arrays including a predetermined memory array. A plurality of bias-voltage supply circuits respectively supply operating voltages to the memory arrays, the bias-voltage supply circuits including a predetermined supply circuit which supplies an operating voltage to the predetermined memory array. A control circuit controls the bias-voltage supply circuits respectively when a command is externally transmitted to the control circuit. The control circuit outputs a disable signal to the predetermined supply circuit in response to a partial-sleep-mode set command externally transmitted thereto, the disable signal causing the predetermined supply circuit to stop supplying the operating voltage to the predetermined memory array. The control circuit outputs an enable signal to the predetermined supply circuit in response to a cancel command externally transmitted thereto, the enable signal causing the predetermined supply circuit to start the supply of the operating voltage to the predetermined memory array.

8 Claims, 4 Drawing Sheets

SEMICONDUCTOR MEMORY DEVICE

BACKGROUND OF THE INVENTION

1. Field of the Invention

The present invention relates to a semiconductor memory device having plural memory arrays on a semiconductor chip.

2. Description of the Related Art

A semiconductor memory device having a memory array on a semiconductor chip is known. With an increase of a level of integration of the semiconductor memory on the chip, there is a demand to reduce a current consumption of memory cells constituting the memory array and to lower an operating voltage of the memory array. The semiconductor memory device is provided with a bias-voltage supply circuit which is adapted to suit the demand. The bias-voltage supply circuit produces a lowered operating voltage from a source voltage of an external battery and supplies the lowered operating voltage to the memory array of the chip.

It is necessary to pass a comparatively large amount of current through the bias-voltage supply circuit in order to avoid a malfunction of the bias-voltage supply circuit caused by noise. However, a current consumption of the bias-voltage supply circuit when the semiconductor memory device is placed in a waiting condition (which will be called a waiting-condition current consumption) is a problem in reducing the current consumption of the semiconductor memory device.

For example, Japanese Laid-Open Patent Applications No. 9-17181, No. 6-242847 and No. 5-206752 disclose bias-voltage supply circuits of semiconductor devices adapted to lower the waiting-condition current consumption.

However, the bias-voltage supply circuits of the above publications are not effective in reducing the waiting-condition current consumption of the semiconductor device when the semiconductor device continues to operate in a standby mode for a long time.

A semiconductor memory device of a certain type is able to operate in a sleep mode, instead of the standby mode, when it is needed to stay in a waiting condition for a long time. The sleep mode is intended to eliminate the problem of the bias-voltage supply circuits of the above publications.

In the above-mentioned semiconductor memory device, when the semiconductor memory device is instructed by a CPU (central processing unit), the semiconductor memory device is set in the sleep mode. During the sleep mode, the operation of the bias-voltage supply circuit is stopped, and the waiting-condition current consumption as in the bias-voltage supply circuits of the above publications can be reduced.

In recent years, a semiconductor memory device having plural memory arrays on a semiconductor chip has been developed. The memory arrays of the semiconductor memory device of this type include, for example, a program memory array storing a program and a data memory array storing data.

However, in the semiconductor memory device of the above-mentioned type, it is necessary that a certain period is passed after a receipt of a cancel command to cancel the sleep mode, in order for the bias-voltage supply circuits to start supplying the operating voltage to the memory arrays in a stable condition. After such a delay of a certain period, the supply of the operating voltage to the memory arrays by the bias-voltage supply circuits is started. After the delay of the period, the semiconductor memory device of this type is placed in the active condition, and then the memory arrays are accessible to the CPU.

Therefore, during the period, the CPU is unable to access the memory arrays although the cancel command to cancel the sleep mode is already transmitted to the control circuit. Hence, the semiconductor memory device of this type during the sleep mode causes a difficulty in speedily accessing the memory arrays after the receiving of the cancel command from the CPU.

SUMMARY OF THE INVENTION

An object of the present invention is to provide an improved semiconductor memory device in which the above-described problems are eliminated.

Another object of the present invention is to provide a semiconductor memory device which effectively reduces a waiting-condition current consumption and allows the CPU to speedily access the memory arrays after a cancel command is transmitted to the control circuit to cancel the waiting condition and start the active condition of the semiconductor memory device.

The above-mentioned objects of the present invention are achieved by a semiconductor memory device including: a plurality of memory arrays which are provided on a semiconductor chip, the memory arrays including a predetermined memory array; a plurality of bias-voltage supply circuits which respectively supply operating voltages to the memory arrays, the bias-voltage supply circuits including a predetermined supply circuit supplying an operating voltage to the predetermined memory array; and a control circuit which controls the bias-voltage supply circuits respectively when a command is externally transmitted to the control circuit, the control circuit outputting a disable signal to the predetermined supply circuit in response to a partial-sleep-mode set command externally transmitted to set the memory device in a partial-sleep mode, the disable signal causing the predetermined supply circuit to stop supplying the operating voltage to the predetermined memory array, and the control circuit outputting an enable signal to the predetermined supply circuit in response to a cancel command externally transmitted to cancel the partial-sleep mode and activate the memory device, the enable signal causing the predetermined supply circuit to start the supply of the operating voltage to the predetermined memory array.

The semiconductor memory device of the present invention is set in the partial-sleep mode in response to the partial-sleep-mode set command transmitted by a CPU. During the partial-sleep mode of the semiconductor memory device, the supply of the operating voltage to the predetermined memory array is stopped, and the supply of the operating voltages to the memory arrays other than the predetermined memory array is maintained. The semiconductor memory device has no current consumption at the predetermined memory array during the partial-sleep mode, and the waiting-condition current consumption during the partial-sleep mode is reduced. The bias-voltage supply circuits other than the predetermined supply circuit steadily supplies the operating voltages to the other memory arrays regardless of the cancellation of the partial-sleep mode. Hence, the CPU can immediately access the other memory arrays after the cancellation of the partial-sleep mode. During the active condition after the cancellation of the partial-sleep mode, the semiconductor memory device has no current consumption at the predetermined memory array until the predetermined memory array is accessed by the CPU. Hence, the semiconductor memory device of the present invention makes it possible to effectively reduce the waiting-condition current consumption during the partial-sleep mode, and allows the CPU to speedily access the other memory arrays immediately after the cancel command is transmitted to the control circuit.

BRIEF DESCRIPTION OF THE DRAWINGS

Other objects, features and advantages of the present invention will become more apparent from the following detailed description when read in conjunction with the accompanying drawings in which.

DETAILED DESCRIPTION OF THE PREFERRED EMBODIMENT

Before describing the preferred embodiment of the present invention, a configuration and operation of a semiconductor memory device having plural memory arrays on a semiconductor chip will be described with reference to the accompanying drawings, for the sake of providing a good understanding of the present invention.

Figure 3:
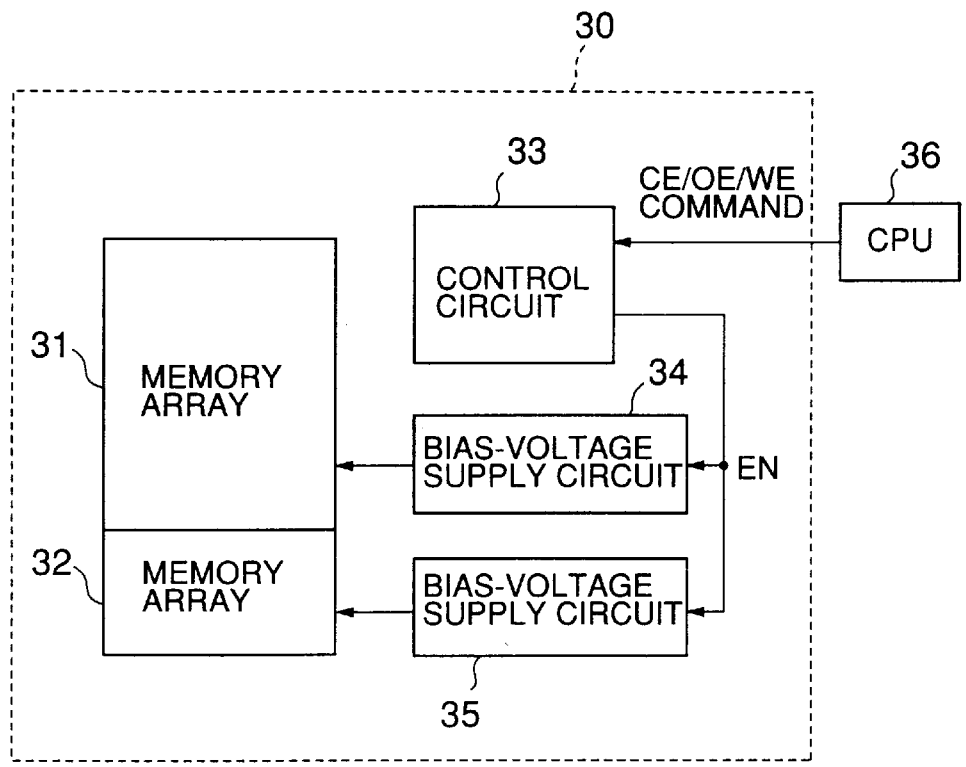
FIG. 3 is a block diagram of a semiconductor memory device having two memory arrays on a semiconductor chip.

FIG. 3 shows a semiconductor memory device 30 of the above-mentioned type. In the semiconductor memory device 30 of FIG. 3, a memory array 31 and a memory array 32 are provided on a semiconductor chip. A bias-voltage supply circuit 34 is provided to supply an operating voltage to the memory array 31, and a bias-voltage supply circuit 35 is provided to supply an operating voltage to the memory array 32. A CPU (central processing unit) 36 is provided outside the semiconductor memory device 30.

The CPU 36 transmits a sleep-mode set command to a control circuit 33 in accordance with an operating condition of the semiconductor memory device 30. When the sleep-mode set command is transmitted to the control circuit 33, the semiconductor memory device 30 is set in a sleep mode. When a cancel command is transmitted to the control circuit 33 by the CPU 36, a previously-set mode of the semiconductor memory device 30 is canceled and the semiconductor memory device 30 is placed in an active condition.

In addition, the CPU 36 transmits an access command to the control circuit 33 when the memory arrays 31 and 32 of the semiconductor memory device 30 are accessible. The access command, transmitted to the control circuit 33 by the CPU 36, includes a command type, an address portion and a data portion. These portions of the access command are arranged in a predetermined command format. The command type may be one of a chip-enable command (CE), an output-enable command (OE) and a write-enable command (WE).

The control circuit 33 recognizes the command transmitted by the CPU 36, by executing a command recognition sequence between the control circuit 33 and the CPU 36. When the transmitted command is recognized as being the sleep-mode set command, the control circuit 33 outputs a low-state enable signal (which is called the disable signal EN) to each of the bias-voltage supply circuits 34 and 35. The supply of operating voltages to the memory arrays 31 and 32 by the bias-voltage supply circuits 34 and 35 is stopped in response to the disable signal EN. Hence, the semiconductor memory device 30 is set in the sleep mode.

During the sleep mode of the semiconductor memory device 30, the cancel command is transmitted to the control circuit 33 by the CPU 36. When the transmitted command is recognized as being the cancel command, the control circuit 33 outputs a high-state enable signal (which is called the enable signal EN) to each of the bias-voltage supply circuits 34 and 35. The supply of the operating voltages to the memory arrays 31 and 32 by the bias-voltage supply circuits 34 and 35 is started in response to the enable signal EN.

In the semiconductor memory device 30 of FIG. 3, it is necessary that a certain period is passed after the receipt of the cancel command in order for the bias-voltage supply circuits 34 and 35 to start supplying the operating voltages to the memory arrays 31 and 32 in a stable condition. After such a delay of a certain period, the supply of the operating voltages to the memory arrays 31 and 32 by the bias-voltage supply circuits 34 and 35 is started. Hence, after the delay of the period, the semiconductor memory device 30 is placed in the active condition, and then the memory arrays 31 and 32 are accessible to the CPU 36.

Figure 4:
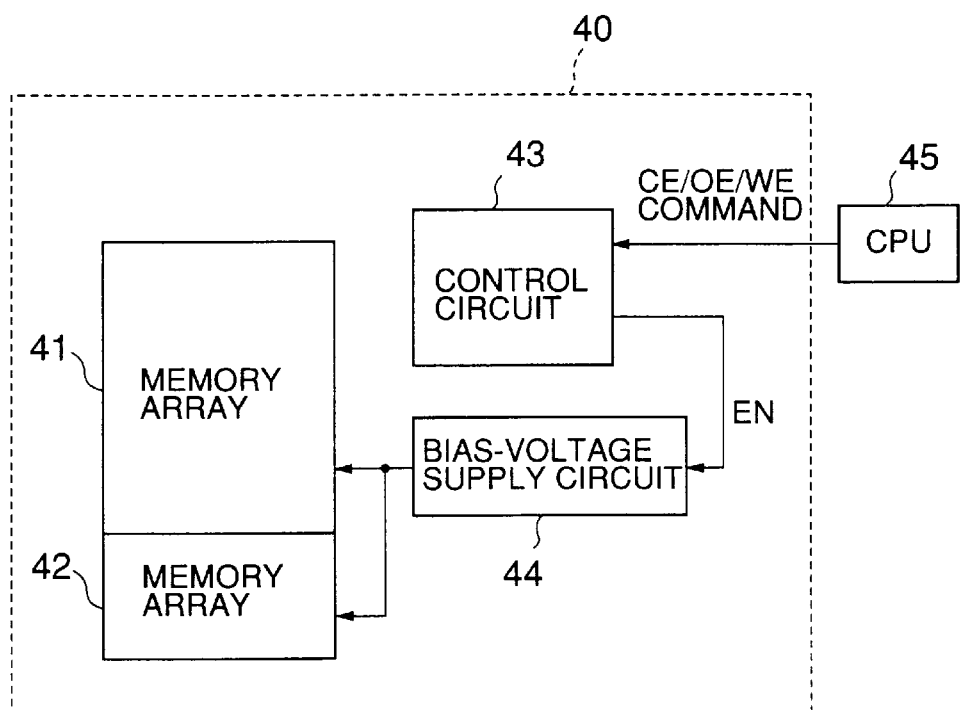
FIG. 4 is a block diagram of another semiconductor memory device having two memory arrays on a semiconductor chip.

FIG. 4 shows another semiconductor memory device 40 of the above type. In the semiconductor memory device 40 of FIG. 4, a memory array 41 and a memory array 42 are provided on a semiconductor chip. A bias-voltage supply circuit 44 is provided to supply an operating voltage to each of the memory arrays 41 and 42. A CPU (central processing unit) 45 is provided outside the semiconductor memory device 40.

The CPU 45 transmits a sleep-mode set command to a control circuit 43 in accordance with an operating condition of the semiconductor memory device 40. When the sleep-mode set command is transmitted to the control circuit 43, the semiconductor memory device 40 is set in a sleep mode. When a cancel command is transmitted to the control circuit 43 by the CPU 45, a previously-set mode of the semiconductor memory device 40 is canceled and the semiconductor memory device 40 is placed in an active condition.

The control circuit 43 recognizes the command transmitted by the CPU 45, by executing a command recognition sequence between the control circuit 43 and the CPU 45. When the transmitted command is recognized as being the sleep-mode set command, the control circuit 43 outputs a low-state enable signal (which is called the disable signal EN) to the bias-voltage supply circuit 44. The supply of the operating voltage to the memory arrays 41 and 42 by the bias-voltage supply circuit 44 is stopped in response to the disable signal EN. Hence, the semiconductor memory device 40 is set in the sleep mode.

During the sleep mode of the semiconductor memory device 40, the cancel command is transmitted to the control circuit 43 by the CPU 45. When the transmitted command is recognized as being the cancel command, the control circuit 43 outputs a high-state enable signal (which is called the enable signal EN) to the bias-voltage supply circuit 44. The supply of the operating voltage to the memory arrays 41 and 42 by the bias-voltage supply circuit 44 is started in response to the enable signal EN.

Similar to the device 30 of FIG. 3, it is necessary that, in the semiconductor memory device 40 of FIG. 4, a certain period is passed after the receipt of the cancel command in order for the bias-voltage supply circuit 44 to start supplying the operating voltage to the memory arrays 41 and 42 in a stable condition. After such a delay of a certain period, the supply of the operating voltage to the memory arrays 41 and 42 by the bias-voltage supply circuit 44 is started. Hence, after the delay of the period, the semiconductor memory device 40 is placed in the active condition, and then the memory arrays 41 and 42 are accessible to the CPU 45.

In the semiconductor memory device 40 of FIG. 4, the bias-voltage supply circuit 44 supplies the operating voltage to each of the memory arrays 41 and 42, and a common current flows through the memory arrays 41 and 42. A waiting-condition current consumption of the semiconductor memory device 40 apparently is smaller than a waiting-condition current consumption of the semiconductor memory device 30. However, it is necessary for the semiconductor memory device 40 to increase circuit components values so as to suit the loads of the memory arrays 41 and 42. Hence, actually, the waiting-condition current consumption of the semiconductor memory device 40 is essentially the same as the waiting-condition current consumption of the semiconductor memory device 30.

Figure 5:
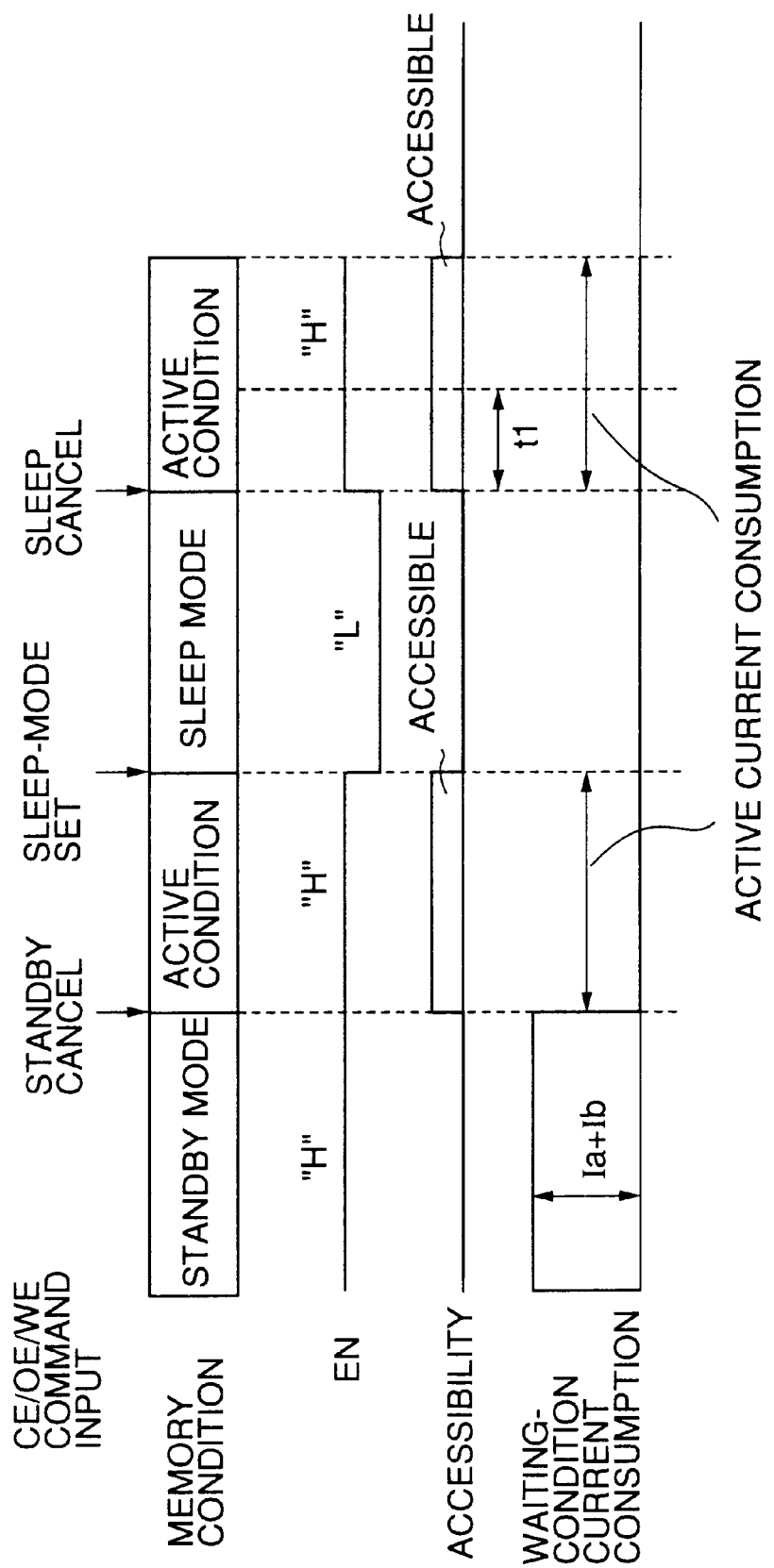
FIG. 5 is a time chart for explaining an operation of the semiconductor memory device of FIG. 3 or FIG. 4 when a command is transmitted from a CPU to a control circuit.

FIG. 5 shows an operation of the semiconductor memory device of FIG. 3 or FIG. 4 when a command is transmitted to the control circuit by the CPU. In FIG. 5, the memory condition, the high-state ("H") or low-state ("L") of the enable signal EN, the accessibility of the memory, and the waiting-condition current consumption are shown.

As shown in FIG. 5, the semiconductor memory device 30 or 40 during a standby mode has a waiting-condition current consumption ("Ia+Ib") at the two memory arrays. When a cancel command is transmitted to the control circuit by the CPU, the standby mode is canceled and the semiconductor memory device 30 or 40 is placed in an active condition. During the active condition, the semiconductor memory device 30 or 40 has an active current consumption at the memory arrays depending on the accessing situation in which the memory arrays are accessed by the CPU as shown in FIG. 5.

During the sleep mode, the supply of the operating voltage to the memory arrays is stopped, and the semiconductor memory device 30 or 40 does not have any current consumption at the memory arrays, like the waiting-condition current consumption ("Ia+Ib") required during the standby mode as shown in FIG. 5. When a cancel command is transmitted to the control circuit by the CPU, the sleep mode is canceled and the semiconductor memory device 30 or 40 will be placed in an active condition.

However, it is necessary that a certain period ("t1") is passed after the receipt of the cancel command in order for the bias-voltage supply circuits to start supplying the operating voltage to the memory arrays in a stable condition. After such a delay of a certain period ("t1"), the supply of the operating voltage to the memory arrays by the bias-voltage supply circuits is started. After the delay of the period ("t1"), the semiconductor memory device 30 or 40 is placed in the active condition, and then the memory arrays are accessible to the CPU.

Therefore, during the period "t1", the CPU is unable to access the memory arrays although the cancel command to cancel the sleep mode is already transmitted to the control circuit. Hence, the semiconductor memory device 30 or 40 during the sleep mode causes a difficulty in speedily accessing the memory arrays after the receiving of the cancel command from the CPU.

Next, a description will now be given of the preferred embodiment of the present invention with reference to the accompanying drawings.

Figure 1:
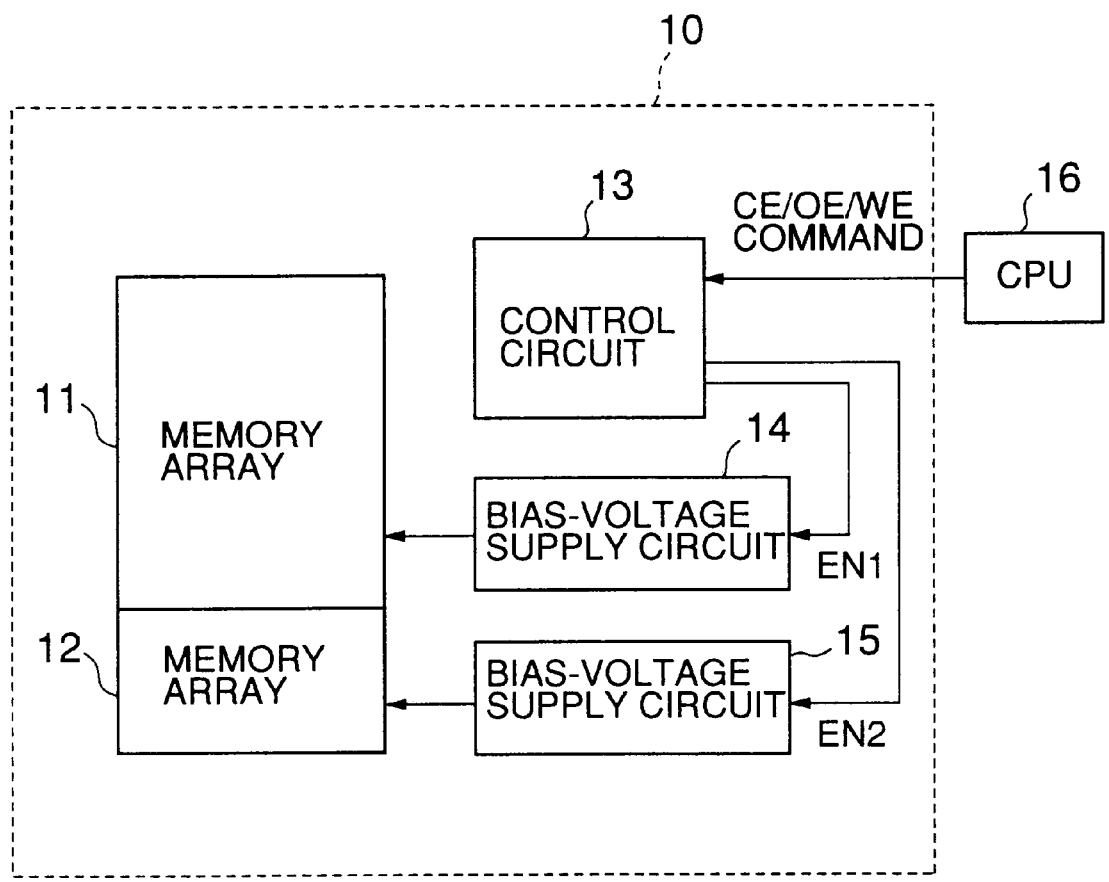
FIG. 1 is a block diagram of a semiconductor memory device embodying the present invention.

FIG. 1 shows an embodiment of a semiconductor memory device of the present invention.

As shown in FIG. 1, a semiconductor memory device 10 includes two memory arrays 11 and 12 provided on a semiconductor chip. A bias-voltage supply circuit 14 produces a first operating voltage from a source voltage of a battery (not shown) and supplies the first operating voltage to the memory array 11. A bias-voltage supply circuit 15 produces a second operating voltage from the source voltage of the battery and supplies the second operating voltage to the memory array 12. A control circuit 13 outputs an enable signal EN1 to the bias-voltage supply circuit 14 and outputs an enable signal EN2 to the bias-voltage supply circuit 15.

In the semiconductor memory device 10 of the present embodiment, the memory arrays 11 and 12 constitute non-volatile memories on the semiconductor chip.

When the enable signal EN1 output by the control circuit 13 is set in a high state ("H"), the bias-voltage supply circuit 14 starts supplying the first operating voltage to the memory array 11. When the enable signal EN1 output by the control circuit 13 is set in a low state ("L"), the supply of the first operating voltage to the memory array 11 by the bias-voltage supply circuit 14 is stopped. When the enable signal EN2 output by the control circuit 13 is set in a high state ("H"), the bias-voltage supply circuit 15 starts supplying the second operating voltage to the memory array 12. When the enable signal EN2 output by the control circuit 13 is set in a low state ("L"), the supply of the second operating voltage to the memory array 12 by the bias-voltage supply circuit 15 is stopped.

A CPU (central processing unit) 16 is provided outside the semiconductor memory device 10. The CPU 16 transmits a mode command to the control circuit 13 in accordance with an operating condition of the semiconductor memory device 10. The mode command, transmitted to the control circuit 13 by the CPU 16, may be one of a sleep-mode set command, a partial-sleep-mode set command, and a cancel command. When one of the sleep-mode set command and the partial-sleep-mode set command is transmitted to the control circuit 13, the semiconductor memory device 10 is set in a corresponding one of a sleep mode and a partial sleep mode, depending on the transmitted command. When the cancel command is transmitted to the control circuit 13 by the CPU 16, a previously-set mode of the semiconductor memory device 10 is canceled and the semiconductor memory device 10 is placed in an active condition.

The control circuit 13 recognizes the command, sent by the CPU 16, by executing a command recognition sequence between the control circuit 13 and the CPU 16. In accordance with the result of the command recognition, the control circuit 13 outputs the enable signals EN1 and EN2 to the bias-voltage supply circuits 14 and 15 in a controlled manner.

The CPU 16 transmits an access command to the control circuit 13 when the memory arrays 11 and 12 of the semiconductor memory device 10 are held to be accessible. The access command, transmitted to the control circuit 13 by the CPU 16, includes a command type, an address portion and a data portion. These portions of the access command are arranged in a predetermined command format. The command type, included in the access command, may be one of a chip-enable command (CE), an output-enable command (OE) and a write-enable command (WE). Similarly to the mode command, the control circuit 13 recognizes the access command, sent by the CPU 16, by executing a command recognition sequence between the control circuit 13 and the CPU 16. In accordance wit the result of the command recognition, the control circuit 13 performs a memory access procedure for the memory arrays 11 and 12, such as a chip enable control, an output enable control, or a write enable control.

The command recognition sequence executed between the control circuit 13 and the CPU 16 is a known command recognition method which is frequently used for setting a test mode of a DRAM (dynamic random access memory) or an SRAM (static random access memory), and a description thereof will be omitted.

Figure 2:
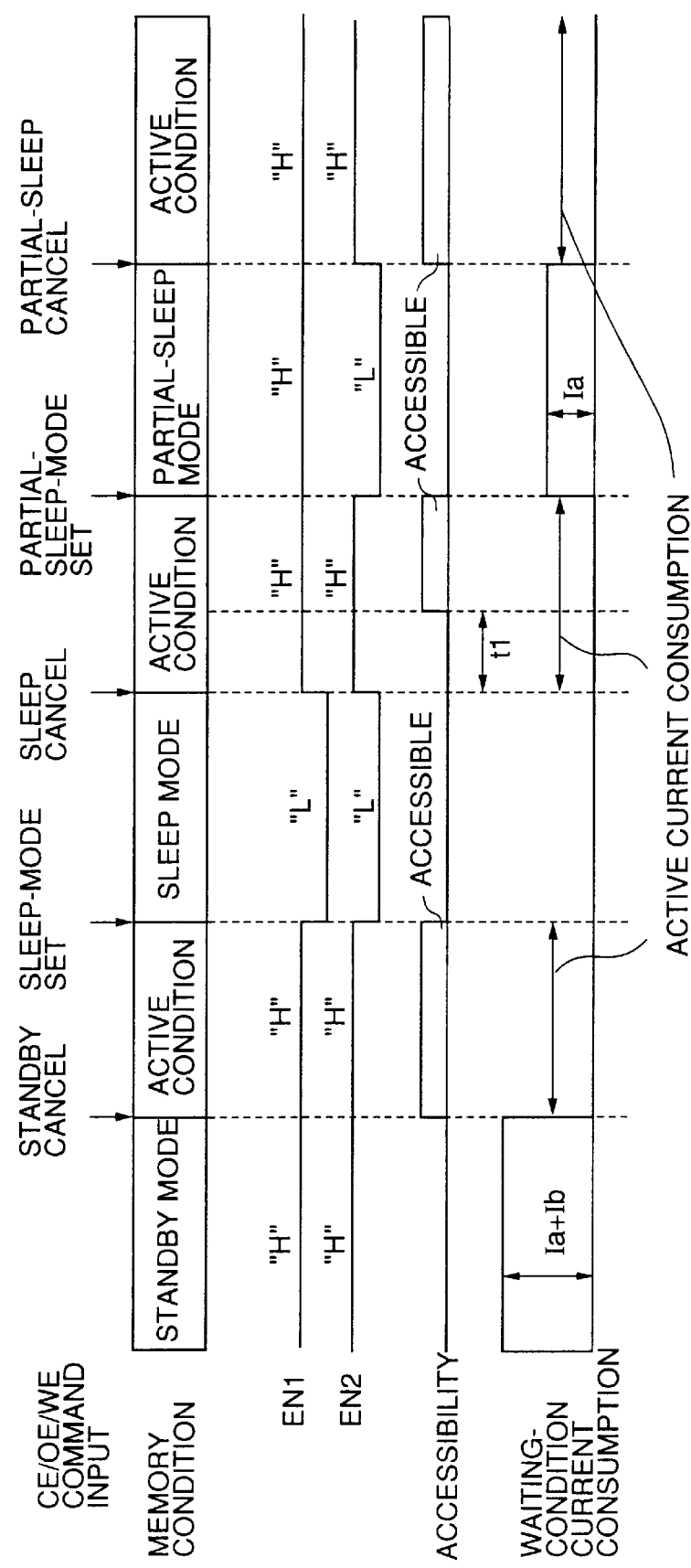
FIG. 2 is a time chart for explaining an operation of the semiconductor memory device of FIG. 1 when a command is transmitted from a CPU to a control circuit of the semiconductor memory device.

FIG. 2 shows an operation of the semiconductor memory device 10 of FIG. 1 when a command is transmitted from the CPU 16 to the control circuit 13. In FIG. 2, the memory condition, the high-state ("H") or low-state ("L") of the enable signals EN1 and EN2, the accessibility of the memory, and the waiting-condition current consumption are shown.

(A) STANDBY MODE

In a case in which the CPU 16 has to set the semiconductor memory device 10 in a waiting condition for a comparatively short time, the CPU 16 sets the semiconductor memory device 10 in the standby mode via the control circuit 13. During the standby mode, the enable signals EN1 and EN2, output to the bias-voltage supply circuits 14 and 15 by the control circuit 13, are set in the high state ("H"). The bias-voltage supply circuits 14 and 15 supply the operating voltages to the memory arrays 11 and 12 in accordance with the high-state enable signals EN1 and EN2. Hence, the semiconductor memory device 10 during the standby mode has a waiting-condition current consumption ("Ia+Ib") at the memory arrays 11 and 12 as shown in FIG. 2.

During the standby mode, the semiconductor memory device 10 is maintained such that the operating voltages are steadily supplied to the memory arrays 11 and 12. When the cancel command is transmitted to the control circuit 13 by the CPU 16, the standby mode is canceled and the semiconductor memory device 10 is placed in an active condition. During the active condition, the semiconductor memory device 10 has an active current consumption at the memory arrays 11 and 12 depending on the accessing situation in which the memory arrays 11 and 12 are accessed by the CPU 16 as shown in FIG. 2.

(B) SLEEP MODE

In a case in which the CPU 16 need not immediately access the semiconductor memory device 10 after the cancel command is transmitted to the control circuit 13, the CPU 16 transmits the sleep-mode set command to the control circuit 13. The semiconductor memory device 10 is set in the sleep mode by the sleep-mode set command transmitted to the control circuit 13. When the sleep-mode set command is transmitted to the control circuit 13, the enable signals EN1 and EN2, output to the bias-voltage supply circuits 14 and 15 by the control circuit 13, are set in the low state ("L") as shown in FIG. 2. During the sleep mode, the supply of the operating voltages to the memory arrays 11 and 12 by the bias-voltage supply circuits 14 and 15 are stopped in accordance with the low-state enable signals EN1 and EN2 (which are called the disable signals EN1 and EN2). Hence, during the sleep mode, the semiconductor memory device 10 does not have any current consumption, such as the waiting-condition current consumption ("Ia+Ib") required during the standby mode at the memory arrays 11 and 12 as shown in FIG. 2.

During the sleep mode of the semiconductor memory device 10, no operating voltage is supplied to the memory 11 and 12. When the cancel command is transmitted to the control circuit 13 by the CPU 16, the sleep mode is canceled and the semiconductor memory device 10 will be placed again in the active condition. In response to the cancel command, the enable signals EN1 and EN2, output to the bias-voltage supply circuits 14 and 15 by the control circuit 13, are changed from the low state ("L") to the high state ("H"). The bias-voltage supply circuits 14 and 15 starts supplying the operating voltages to the memory arrays 11 and 12 in accordance with the high-state enable signals EN1 and EN2.

However, it is necessary that a certain period is passed after the receipt of the cancel command in order for the bias-voltage supply circuits 14 and 15 to start supplying operating voltages to the memory arrays 11 and 12. After such a delay of a certain period ("t1"), the supply of the operating voltages to the memory arrays 11 and 12 by the bias-voltage supply circuits 14 and 15 is started. Hence, after the delay of the period ("t1"), the semiconductor memory device 10 is placed in the active condition. During the active condition, the semiconductor memory device 10 has an active current consumption at the memory arrays 11 and 12 depending on the accessing situation in which the memory arrays 11 and 12 are accessed by the CPU 16 as shown in FIG. 2.

As described above, during the active condition of the semiconductor memory device 10 after the cancellation of the sleep mode, the semiconductor memory device 10 has no current consumption at the memory arrays 11 and 12 until the memory arrays 11 and 12 are actually accessed by the CPU 16. However, during the above-mentioned period "t1" (from the time of the cancellation of the sleep mode to the time of the start of supplying of the operating voltages to the memory arrays 11 and 12 in a stable condition), the CPU 16 is unable to access the memory arrays 11 and 12 although the cancel command is already transmitted to the control circuit 13. Hence, it is difficult for the semiconductor memory device 10 during the sleep mode to allow the CPU 16 to speedily access the memory arrays 11 and 12 after the cancel command is transmitted to the control circuit 13.

(C) PARTIAL-SLEEP MODE

A description will now be given of an operation of the semiconductor memory device 10 of the present invention when a partial-sleep-mode set command is transmitted from the CPU 16 to the control circuit 13, with reference to FIG. 2.

In a case in which it is necessary to immediately access the memory arrays 11 and 12 after the cancel command is transmitted to the control circuit 13 and effectively reduce the waiting-condition current consumption of the semiconductor memory device 10, the CPU 16 transmits the partial-sleep-mode set command to the control circuit 13. The semiconductor memory device 10 is set in the partial-sleep mode by the partial-sleep-mode set command transmitted by the CPU 16. When the partial-sleep-mode set command is received at the control circuit 13, the enable signal EN1 is set in the high state ("H") and the enable signal EN2 is set in the low state ("L") as shown in FIG. 2. The supply of the operating voltage to the memory array 11 by the bias-voltage supply circuit 14 is maintained by the high-state enable signal EN1, but the supply of the operating voltage to the memory array 12 by the bias-voltage supply circuit 15 is stopped by the low-state enable signal EN2 (which is called the disable signal EN2). Hence, during the partial-sleep mode, the semiconductor memory device 10 has only a waiting-condition current consumption ("Ia") at the memory array 11 as shown in FIG. 2. This current consumption is smaller than the waiting-condition current consumption "Ia+Ib" required during the standby mode at the memory arrays 11 and 12.

During the partial-sleep mode of the semi-conductor memory device 10, no operating voltage is supplied to the memory array 12. When the cancel command is received at the control circuit 13, the partial-sleep mode is canceled and the semiconductor memory device 10 will be placed again in the active condition. In response to the cancel command, the enable signal EN2 is changed from the low state ("L") to the high state ("H") and the enable signal EN1 is held in the high state ("H"). The bias-voltage supply circuit 15 starts supplying the operating voltage circuit 15 start supplying the operating voltage to the memory array 12 in accordance with the high-state enable signal EN2. The bias-voltage supply circuit 14 steadily supplies the operating voltage to the memory array 11 regardless of the cancellation of the partial-sleep mode. Hence, the memory array 11 of the semiconductor memory device 10 can be immediately accessed after the cancellation of the partial-sleep mode. With respect to the memory array 12, it is necessary that a certain period is passed since the receipt of the cancel command in order for the bias-voltage supply circuit 15 to start supplying the operating voltage to the memory array 12 in a stable condition. During the active condition, the semiconductor memory device 10 has an active current consumption at the memory arrays 11 and 12 depending on the accessing situation in which the memory arrays 11 and 12 are accessed by the CPU 16 as shown in FIG. 2.

As described above, during the active condition of the semiconductor memory device 10 after the cancellation of the partial-sleep mode, the semiconductor memory device 10 has no current consumption at the memory array 12 until the memory array 12 is accessed by the CPU 16. Hence, the semiconductor memory device 10 of the present embodiment makes it possible to effectively reduce a waiting-condition current consumption during the partial-sleep mode, and allows the CPU 16 to speedily access the memory array 11 immediately after the cancel command is transmitted to the control circuit 13.

In the above-described embodiment of FIG. 2, when the partial-sleep-mode set command is transmitted to the control circuit 13, the supply of the operating voltage to the memory array 11 by the bias-voltage supply circuit 14 is maintained, but the supply of the operating voltage to the memory array 12 by the bias-voltage supply circuit 15 is stopped. Alternatively, when the partial-sleep-mode set command is transmitted to the control circuit 13, the control circuit 13 of the semiconductor memory device may be configured such that the supply of the operating voltage to the memory array 12 by the bias-voltage supply circuit 15 is maintained, but the supply of the operating voltage to the memory array 12 by the bias-voltage supply circuit 14 is stopped.

In the above-described embodiment of FIG. 1, the two memory arrays 11 and 12 and the two bias-voltage supply circuits 14 and 15 for supplying the operating voltages to the memory arrays 11 and 12 are provided in the semiconductor memory device 10. Alternatively, a plurality of memory arrays and a corresponding number of bias-voltage supply circuits for respectively supplying operating voltages to the memory arrays may be provided without departing from the scope of the present invention. In such a configuration of the semiconductor memory device, the memory arrays include a predetermined memory array (corresponding to the element 12 of FIG. 1), and the bias-voltage supply circuits include a predetermined supply circuit (corresponding to the element 15 of FIG. 1) which supplies an operating voltage to the predetermined memory array. Moreover, in such a configuration of the semiconductor memory device, the predetermined memory array is arbitrarily selected from the plurality of memory arrays, and the predetermined supply circuit is selected from the plurality of bias-voltage supply circuits in correspondence with the selected one of the plurality of memory arrays.

Further, the present invention is not limited to the above-described embodiment, and variations and modifications may be made without departing from the scope of the present invention.

The present invention is based on Japanese priority application No.10-075387, filed on Mar. 24, 1998, the entire contents of which are hereby incorporated by reference.

What is claimed is:

1. A semiconductor memory device comprising:

a plurality of memory arrays provided on a semiconductor chip, the memory arrays including a predetermined memory array;

a plurality of bias-voltage supply circuits for respectively supplying operating voltages to the memory arrays, the bias-voltage supply circuits including a predetermined supply circuit supplying an operating voltage to the predetermined memory array; and a control circuit for controlling the bias-voltage supply circuits respectively when a command is externally transmitted to the control circuit, the control circuit outputting a disable signal to the predetermined supply circuit in response to a partial-sleep-mode set command externally transmitted to set the memory device in a partial-sleep mode, the disable signal causing the predetermined supply circuit to stop supplying the operating voltage to the predetermined memory array, and the control circuit outputting an enable signal to the predetermined supply circuit in response to a cancel command externally transmitted to cancel the partial-sleep mode and activate the memory device, the enable signal causing the predetermined supply circuit to start the supply of the operating voltage to the predetermined memory array.

2. The semiconductor memory device according to claim 1, wherein the control circuit outputs enable signals to the bias-voltage supply circuits other than the predetermined supply circuit, in response to the partial-sleep-mode set command, the enables signals causing the other bias-voltage supply circuits to maintain the supply of the operating voltages to the memory arrays other than the predetermined memory array.

3. The semiconductor memory device according to claim 1, wherein the control circuit maintains outputting of enable signals to the bias-voltage supply circuits other than the predetermined supply circuit, in response to the cancel command, the enable signals causing the other bias-voltage supply circuits to continue the supply of the operating voltages to the memory arrays other than the predetermined memory array.

4. The semiconductor memory device according to claim 1, wherein the control circuit outputs disable signals to all the bias-voltage supply circuits, including the predetermined supply circuit, in response to a sleep-mode set command externally transmitted to set the memory device in a sleep mode, the disables signals causing all the bias-voltage supply circuits to stop the supply of the operating voltages to all the memory arrays including the predetermined memory array.

5. The semiconductor memory device according to claim 4, wherein the control circuit outputs enable signals to all the bias-voltage supply circuits, including the predetermined supply circuit, in response to a cancel command externally transmitted to cancel the sleep mode and activate the memory device, the enable signals causing all the bias-voltage supply circuits to start the supply of the operating voltages to all the memory arrays including the predetermined memory array.

6. The semiconductor memory device according to claim 2, wherein the control circuit outputs the enable signals and the disable signal to the other bias-voltage supply circuits and the predetermined supply circuit, respectively, in response to the partial-sleep-mode set command, the enables signals causing the other bias-voltage supply circuits to maintain the supply of the operating voltages to the other memory arrays, and the disable signal causing the predetermined supply circuit to stop the supply of the operating voltage to the predetermined memory array.

7. The semiconductor memory device according to claim 1, wherein the predetermined memory array is arbitrarily selected from the plurality of memory arrays, and the predetermined supply circuit is selected from the plurality of bias-voltage supply circuits in correspondence with the selected one of the plurality of memory arrays.

8. The semiconductor memory device according to claim 1, wherein the plurality of memory arrays constitute non-volatile memories on the semiconductor chip.

* * * * *